(12) United States Patent
Yang et al.

(10) Patent No.: US 10,635,007 B1
(45) Date of Patent: Apr. 28, 2020

(54) APPARATUS AND METHOD FOR ALIGNING INTEGRATED CIRCUIT LAYERS USING MULTIPLE GRATING MATERIALS

(71) Applicant: GLOBALFOUNDRIES INC., Grand Cayman (KY)

(72) Inventors: Dongyue Yang, Ballston Spa, NY (US); Keith H. Tabakman, Gansevoort, NY (US); Guanchen He, Clifton Park, NY (US); Xintuo Dai, Rexford, NY (US); Xueli Hao, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/188,814

(22) Filed: Nov. 13, 2018

(51) Int. Cl.
*G03F 9/00* (2006.01)
*H01L 21/68* (2006.01)
(Continued)

(52) U.S. Cl.
CPC ......... *G03F 9/7076* (2013.01); *G02B 5/1861* (2013.01); *G03F 7/70616* (2013.01);
(Continued)

(58) Field of Classification Search
CPC . H01L 21/681; H01L 21/762; H01L 21/0337; H01L 23/544; H01L 2223/54426; H01L 2223/544; H01L 2223/54453; H01L 2223/5446; G02B 5/18; G02B 5/1819; G02B 5/1828; G02B 5/1838; G02B 5/1847; G02B 5/1857; G02B 5/1861; G03F 7/70616; G03F 7/70633; G03F 7/70658; G03F 7/70666; G03F 7/70683;
(Continued)

(56) References Cited

U.S. PATENT DOCUMENTS 6,528,386 B1 * 3/2003 Summerfelt ...... H01L 27/11502
257/E21.664
6,661,106 B1 * 12/2003 Gilmour ............. H01L 23/5258
257/665
(Continued)

OTHER PUBLICATIONS

Bringoltz et al., "Accuracy in Optical Overlay Metrology," Proc. of SPIE vol. 9778 97781H1, Mar. 2016, 20 pages.
(Continued)

*Primary Examiner* — Christina A Riddle
(74) *Attorney, Agent, or Firm* — Anthony Canale; Hoffman Warnick LLC

(57) ABSTRACT

Embodiments of the disclosure provides an apparatus for aligning layers of an integrated circuit (IC), the apparatus including: an insulator layer positioned above a semiconductor substrate; a first diffraction grating within a first region of the insulator layer, the first diffraction grating including a first grating material within the first region of the insulator layer; and a second diffraction grating within a second region of the insulator layer, the second grating including a second grating material within the second region of the insulator layer, wherein the second grating material is different from the first grating material, and wherein an optical contrast between the first and second grating materials is greater than an optical contrast between the second grating material and the insulator layer.

16 Claims, 10 Drawing Sheets

(51) Int. Cl.
*H01L 23/544* (2006.01)
*G03F 7/20* (2006.01)
*G02B 5/18* (2006.01)

(52) U.S. Cl.
CPC .......... *G03F 7/70683* (2013.01); *G03F 9/708* (2013.01); *G03F 9/7073* (2013.01); *G03F 9/7084* (2013.01); *H01L 21/681* (2013.01); *H01L 23/544* (2013.01); *H01L 2223/54426* (2013.01)

(58) Field of Classification Search
CPC ........ G03F 7/7094; G03F 9/70; G03F 9/7003; G03F 9/7049; G03F 9/7073; G03F 9/7076; G03F 9/708; G03F 9/7084; G03F 9/7088; G03F 9/7092
USPC .................. 355/52, 53, 55, 72, 77; 438/401; 356/399–401
See application file for complete search history.

(56) References Cited

U.S. PATENT DOCUMENTS

| | | | |
|---|---|---|---|
| 10,074,612 | B2 | 9/2018 | Chou et al. |
| 2005/0064676 | A1* | 3/2005 | Tobioka ................ H01L 23/544 438/401 |
| 2007/0224706 | A1* | 9/2007 | Izumi ................ H01L 27/11502 438/3 |
| 2008/0212057 | A1* | 9/2008 | Van Haren ............ G03F 9/7076 355/53 |
| 2017/0363970 | A1* | 12/2017 | Cohen ..................... H01L 22/30 |

OTHER PUBLICATIONS

Salerno et al., "Enabling optical metrology on small 5×5um$^2$ in-cell targets to enable flexible sampling and higher overlay control for advanced Logic devices," Proc. of SPIE vol. 10585 105851I-1, Mar. 2018, 12 pages.

Ferreira et al., "Holistic Metrology qualification extension and its application to characterize overlay targets with asymmetric effects," Proc. of SPIE vol. 10585 105850T-1, Mar. 2018, 15 pages.

Tzai et al, "Techniques for improving overlay accuracy by using device correlated metrology targets as reference," J. Micro/Nanolith. MEMS MOEMS 13(4), 041412 (Oct.-Dec. 2014), 7 pages.

Hsu et al., "Innovative fast technique for overlay accuracy estimation using archer self calibration (ASC)," Metrology, Inspection, and Process Control for Microlithography XXVIII, Proc. of SPIE vol. 9050, 2014, 7 pages.

* cited by examiner

APPARATUS AND METHOD FOR ALIGNING INTEGRATED CIRCUIT LAYERS USING MULTIPLE GRATING MATERIALS

BACKGROUND

The present disclosure relates to aligning layers of an integrated circuit (IC) during manufacture, and more specifically, to an apparatus and method for using first and second diffraction gratings to align layers of an IC.

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gates may be composed of various metals and often include a work function metal which is chosen to create desired characteristics of the FET. Transistors may be formed over a substrate and may be electrically isolated with an insulating dielectric layer, e.g., inter-level dielectric (ILD) layer. Contacts may be formed to each of the source, drain, and gate regions through the dielectric layer to connect the transistors to other circuit elements formed in other metal levels.

In the microelectronics industry as well as in other industries involving construction of microscopic structures (e.g., micromachines, magnetoresistive heads, etc.) there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, FETs, and capacitors. Circuit chips with hundreds of millions of such devices are common.

Photolithography is a technique for transferring an image rendered on one media onto another media photographically. Photolithography techniques are widely used in semiconductor fabrication. Typically, a circuit pattern is rendered as a positive or negative mask image which is then projected onto a silicon substrate coated with photosensitive materials (e.g., PR). Reticles are used to control radiation impingement on the masked surface to chemically change those areas of the coating exposed to the radiation, usually by polymerizing the exposed coating. The un-polymerized areas are removed, being more soluble in the developer than the polymerized regions, and the desired image pattern remains.

One challenge with advanced FinFET technology is ensuring proper alignment of parts during photolithography as the manufacturing process progresses. A photolithography reticle scanner identifies overlay marks on a layer of the wafer and precisely positions the reticle for the next layer relative to the wafer, e.g., to be used to pattern a mask used to form the layer. In some cases, parts of the circuit do not align as manufacturing progresses, creating an overlay shift, i.e., a misalignment. Grating asymmetry, i.e., dimensional differences or inconsistencies across different portions of a grating region, is considered a primary cause of misalignment in circuit manufacture. The intrinsic asymmetry of a grating pattern, i.e., reductions in contrast stemming from the design of a grating, may also contribute to misalignment between layers in some circumstances. Intrinsic grating asymmetry is especially problematic because known measurement techniques cannot account for intrinsic design features of an alignment mark.

SUMMARY

A first aspect of the disclosure is directed to an apparatus for aligning layers of an integrated circuit (IC), the apparatus including: an insulator layer positioned above a semiconductor substrate; a first diffraction grating within a first region of the insulator layer, the first diffraction grating including a first grating material within the first region of the insulator layer; and a second diffraction grating within a second region of the insulator layer, the second grating including a second grating material within the second region of the insulator layer, wherein the second grating material is different from the first grating material, and wherein an optical contrast between the first and second grating materials is greater than an optical contrast between the second grating material and the insulator layer.

A second aspect of the disclosure relates to an apparatus for aligning layers of an integrated circuit (IC), the apparatus including: an insulator layer positioned above a semiconductor substrate; and a plurality of alignment marks within the insulator layer, each of the plurality of alignment marks including: a first diffraction grating within a first region of the insulator layer, the first diffraction grating including a first grating material within the first region of the insulator layer, and a second diffraction grating within a second region of the insulator layer, the second grating including a second grating material within the second region of the insulator layer, wherein the second grating material is different from the first grating material, and an optical contrast between the first and second grating materials is greater than an optical contrast between the second grating material and the insulator layer; wherein the first and second diffraction grating of each of the plurality of alignment marks are oriented horizontally within the insulator layer, and wherein at least one of the plurality of alignment marks is oriented horizontally perpendicularly with respect to another one of the plurality of alignment marks.

A third aspect of the disclosure is directed to a method to form an alignment mark for an integrated circuit (IC), the method including: forming a plurality of trenches within an insulator layer positioned above a semiconductor substrate, wherein the plurality of trenches includes at least one first trench in a first region of the insulator layer and at least one second trench in a second region of the insulator layer; forming a mask on the insulator layer to cover the first region of the insulator layer; forming a first grating material within the at least one first trench; removing the mask; and forming a second grating material within the at least one second trench, wherein the second grating material is different from the first grating material, and an optical contrast between the first and second grating materials is greater than an optical contrast between the second grating material and the insulator layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
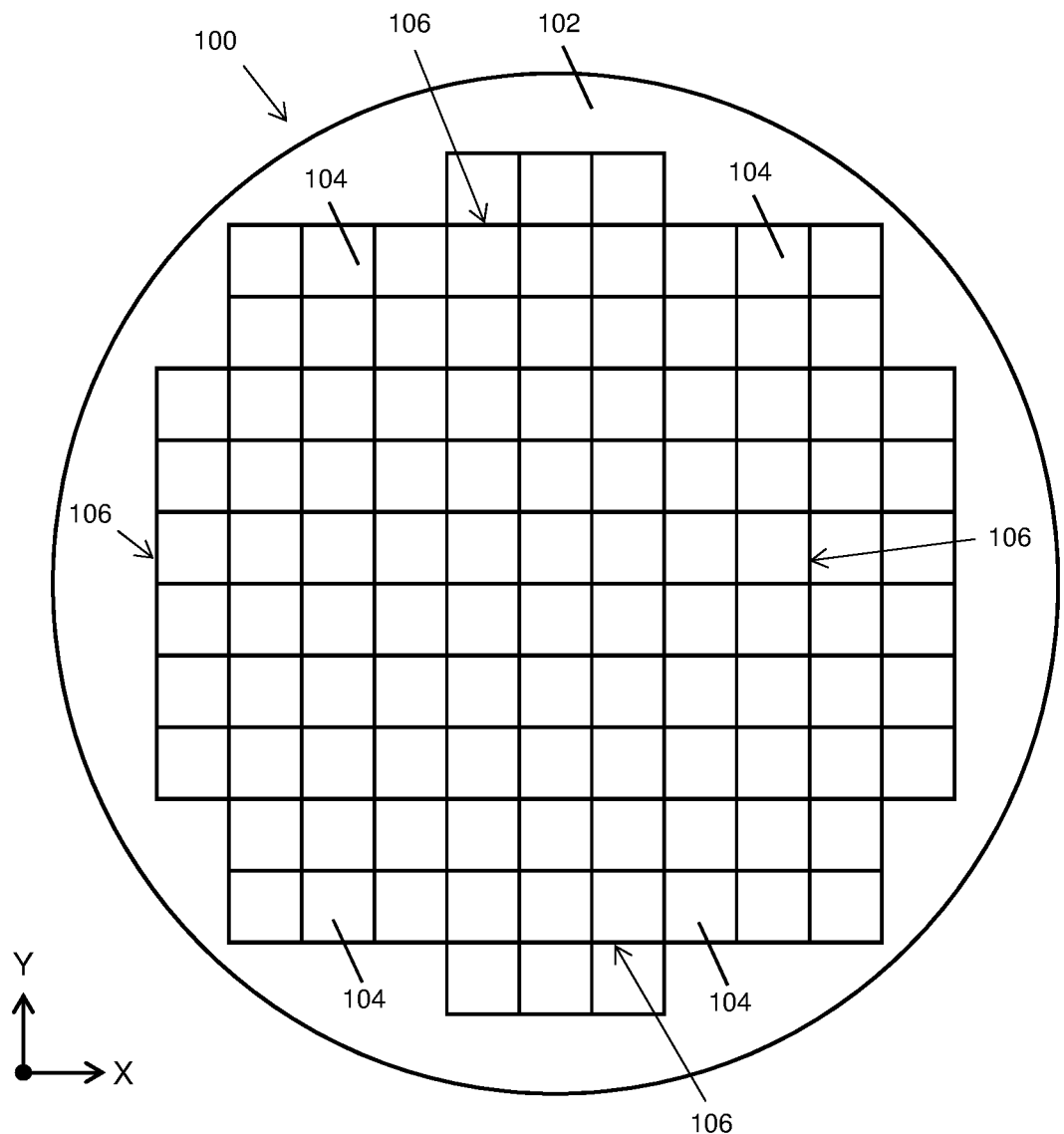
FIG. 1 shows a schematic plan view in plane X-Y of an illustrative integrated circuit (IC) layout.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide an apparatus for aligning layers of an integrated circuit (IC). Embodiments of the disclosure also include methods of forming the apparatus for aligning layers of the IC, e.g., to form masking layers in predetermined locations while an IC structure is processed. The various embodiments may include multiple diffraction gratings formed in an insulator layer, with at least one diffraction grating being formed of a material different from another diffraction grating. The two different grating materials may be selected to have a substantial optical contrast with each other, as compared to the relatively low optical contrast between a single diffraction grating and the material composition of the insulator layer. In embodiments of the disclosure, optical contrast may be measured in terms of light intensity and/or other metrics for measuring the ease of visually distinguishing between two locations. Embodiments of the disclosure may counterbalance the inherent, immeasurable asymmetry of conventional alignment marks formed of a single grating material. As further discussed herein, embodiments of the disclosure may use a single collection of trenches to form the two different grating materials.

Referring FIG. 1, an IC wafer 100 (depicted via plan view in plane X-Y) may include a body 102 encompassing, e.g., one or more semiconductor materials, dielectric materials, conductive materials, manufactured to include the device architecture of several products. Body 102 more specifically may include multiple vertically separated layers therein, with at least two of those layers being separately identified herein as first and second layers (e.g., layers L1, L2 of FIG. 2). The various portions of IC wafer 100 to be separated into distinct products or groups of products may be identified as circuit dies 104 to be separated into individual units. Each circuit die 104 may be distinguished from other circuit dies 104 on IC wafer 100 by a set of scribe lines 106 indicating the specific locations where body 102 of IC wafer 100 will be diced in subsequent processing. Scribe lines 106 may take the form of grooves formed within IC wafer 100, and thus may be visible to an observer in some instances. As shown, scribe lines 106 may be arranged in the shape of a grid on body 102, such that each circuit die 104 covers a uniform surface area on body 102. Non-rectangular portions of body 102 may be positioned outside scribe lines 106.

The various regions and components of IC wafer 100 may have distinct roles before and after IC wafer 100 is separated into individual circuit dies. IC wafer 100 may be configured for dicing via one or more mechanical instruments (e.g., dicing blades), and/or other currently known or later developed instruments such as laser dicing tools, etc. During manufacture, each circuit die 104 of IC wafer 100 may be processed to create one or more functional components of a device by successive deposition, masking, etching, etc., as known in the art. Portions of IC wafer 100 not included in a respective circuit die 104 may not include one or more functional components after manufacturing concludes. Each circuit die 104 thus may include sets of metal wires, vias, device components, dielectric materials, etc., therein, though such components are omitted from the depiction of IC wafer 100 in FIG. 1 solely for clarity of illustration. Functional components in each circuit die 104 are conventionally structured only to yield the structural and operational features of each device formed from IC wafer 100. Embodiments of the disclosure are concerned with aligning various masks, deposited materials, etchants, etc., with targeted components before IC wafer 100 is diced.

Figure 2:
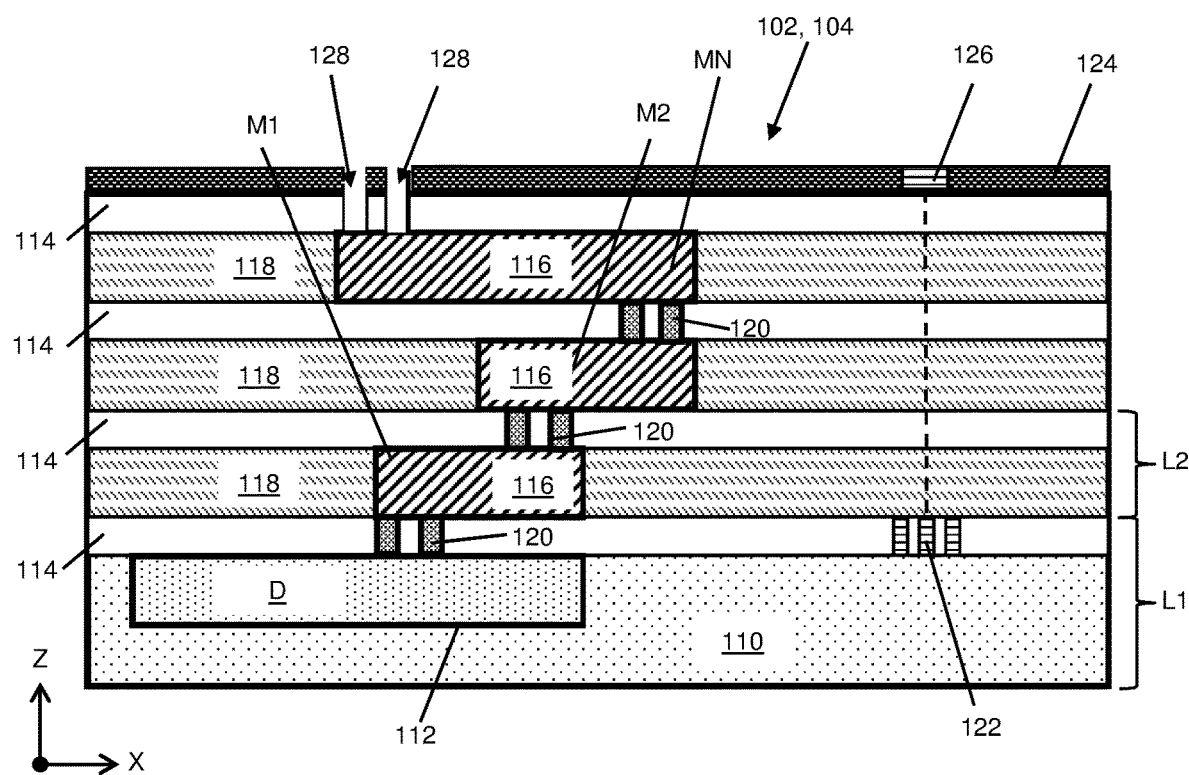
FIG. 2 shows a cross-sectional view of a conventional apparatus for aligning layers of the IC structure.

Turning now to FIG. 2, a cross-sectional view of one circuit die 104 of IC wafer 100 (FIG. 1) illustrates a conventional approach for aligning consecutive vertically-stacked layers of IC wafer 100. Circuit die 104 may include a substrate 110, serving as a base material to form one or more devices and a foundation for subsequently-formed metal wiring levels of a structure. Substrate 130 may include, e.g., one or more currently-known or later developed semiconductive substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Substrate 110 may be situated in a first level L1 of circuit die 104. One or more active regions 112 (including, e.g., doped semiconductor material) may define a device layer D, also known as an active region, of circuit die 104. Device layer D may include various active components (e.g., transistors, capacitors, resistors, etc.) formed at least partially within active region 112 of substrate 110, and such components are omitted from FIG. 2 for clarity of illustration.

First layer L1 may include an inter-level dielectric (ILD) 114 formed on substrate 110 and active region 112 to physically and electrically separate device layer D from various overlying wiring layers. ILD 114 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Each level of circuit die 104 above first level L1 may include various wiring materials for providing internal connections within circuit die 104, and/or to form electrical pathways to external components. Circuit die 104 may include a second level L2 having one or more metal wires 116. Metal wire(s) 116 may be composed of any currently known or later-developed electrically conductive material including, e.g., copper (Cu), aluminum (Al), silver (Ag), gold (Au), combinations thereof, etc. Metal wires 116 can be formed and positioned within an intermediate layer 118 of electrically insulative or semiconductive material (e.g., a region of semiconductor material or an electrically insulating dielectric material), such that metal wires 116 transmit electricity between other electrically conductive structures in contact therewith. Metal wires 116 positioned within a lowermost metal level M1 can extend in a particular direction (e.g., along axis X). Metal wires 116 positioned within an uppermost metal level MN can similarly extend along axis X in the same direction as metal wire(s) 116 in lowermost metal level M1, or a different direction. Three different metal levels are shown in the partially-manufactured circuit die 104 of FIG. 2, and circuit die 104 may include any conceivable number of metal levels. In a partially or fully manufactured product, for example, circuit die 104 may include five metal levels, ten metal levels, twenty metal levels, one-hundred or more metal levels, etc. Lowermost metal level M1 and uppermost metal level MN may be vertically separated from each other (e.g., along axis "Z" shown in FIG. 5), either as directly adjacent metal levels or with intervening metal and insulator levels positioned therebetween.

Metal wires 116 within different metal levels (e.g., lowermost metal level M1 and uppermost metal level MN) may be electrically connected to each other with vias 120, each via extending vertically between lowermost metal level M1 and uppermost metal level MN. Vias 120 can be composed of the same electrically conductive material(s) as each metal wire 116, or can be composed of one or more different conductive materials. Each via 120, in an embodiment, can comprise any standard conductive metal (for example, copper) with a lining material (not shown) thereon, such as tantalum nitride (TaN).

Lowermost and uppermost metal levels M1, MN can be separated from one another by one or more intervening metal levels (labeled, e.g., as M2). As suggested by the notations MN and M1, the number of metal levels can vary depending on the chosen implementation and any requirements for back end of line (BEOL) processing. Circuit die 104 may also include additional regions of ILD 114 between each successive metal level M1, M2, MN. In one embodiment, one or more vias 120 may extend from one metal level to an adjacent metal level, such that metal wire(s) 116 in lowermost metal level M1 may be electrically connected to metal wire(s) 116 in uppermost metal level MN of circuit die 104.

In the cross-sectional view of circuit die 104, a diffraction grating 122 may be formed within body 102 and/or circuit die 104 at first layer L1 (e.g., within ILD 114). Diffraction grating 122 may include one or more materials (e.g., metals, dielectric materials, etc.) configured to reflect light and thereby identify a specific position within first layer L1. During processing, various masks and/or other materials may rely on diffraction grating 122 for positional calibration, e.g., to identify targeted locations for overlying metal levels, dielectric materials, etc. FIG. 2 represents a partially-manufactured circuit die 104, currently undergoing a process to form connective vias to metal level 116 of uppermost metal level MN. To remove portions of ILD 114 above uppermost metal level MN, and form conductive metal(s) therein, continued manufacture may include forming a mask 124 over ILD 114 to target specific locations above uppermost metal level MN. Mask 124 may include one or more overlay marks 126 formed of a translucent material configured for substantial vertical alignment with diffraction grating 122 of first layer L1. Substantially vertically aligning overlay mark(s) 126 with corresponding diffraction grating(s) 122 may allow a manufacturer to confirm whether subsequent wires, vias, etc., will be in alignment with each other. As shown by example, continued manufacture of circuit die 104 may include forming openings 128 to metal level 116 to form a contact or connecting via to subsequently-formed layers. As noted above, the risk of misalignment between diffraction grating(s) 122 and overlay mark(s) 126 may be a source of manufacturing sensitivity. Conventional techniques rely on optical contrast between diffraction grating(s) 122 and the insulator material of ILD 114 to confirm the alignment between mask 124 and a targeted location. As also noted above, however, inherent asymmetry of diffraction grating 122 may cause errors in alignment, with such errors being undetectable via conventional alignment measurements or techniques.

Figure 3:
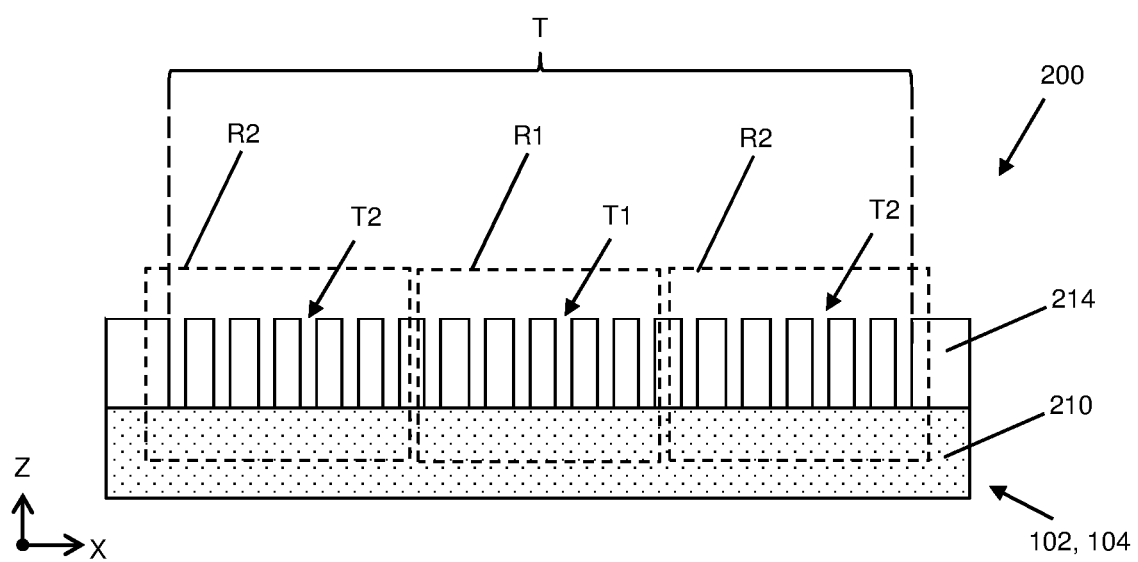
FIG. 3 shows a cross-sectional view of forming an insulator layer and set of trenches over a substrate in methods according to embodiments of the disclosure.

FIG. 3 depicts an initial phase of forming an apparatus to align layers of an IC according to embodiments of the disclosure. An initial structure 200 may include a substrate 210 with an insulator layer 214 (e.g., identical or similar to ILD 114 (FIG. 2)) formed thereon. Initial structure 200 may be part of a circuit die 104 (FIGS. 1, 2) currently undergoing manufacture. Initial structure 200 may represent a region of body 102 or circuit die 104 which does not include functional circuit components. Initial structure 200 may be an alignment region of circuit die 104 or other area suitable for aligning one or more locations of substrate 210 with overlying materials, e.g., one or more regions of a mask to form metal layers in subsequent processing. Subsequent processing of initial structure 200 may allow multiple diffraction grating materials to be formed over substrate 210, thereby providing greater optical contrast as compared to conventional gratings. In this context, the term "optical contrast" refers to any metric representing the degree to which two materials may be visually distinguished from each other. Such metrics may include, e.g., differences in light intensity, image pixel intensity, general visibility (measured, e.g., via Michelson contrast ratio), etc., between two locations or materials under analysis.

Insulator layer 214 may include at least one first region R1 and at least one second region R2. First and second regions R1, R2 of insulator layer 214, at this point, may be substantially identical to each other. First region R1 and second region R2 may be distinguished from each other solely based on whether each region R1, R2 is positioned beneath a subsequently-formed overlay mark of a deposited mask or other layer. According to an example, first region R1 will not be located substantially vertically underneath an overlay mark in a product design. In the same example, second region(s) R2 are portions of insulator layer 214 which will be located substantially vertically underneath an overlay mark.

The processing of initial structure 200 may include, e.g., forming a plurality of trenches T within insulator layer 214. Plurality of trenches T may extend at least partially into insulator layer 214, and in a further example may extend fully vertically through insulator layer 214. As shown in FIG. 3, forming plurality of trenches T may reveal an upper surface of substrate 210. Plurality of trenches T may be formed by any currently known or later developed technique of forming trenches within insulator material, and in various implementations may include selective and/or non-selective etching. Downward directional reactive ion etching (RIE) may be particularly suitable to form plurality of trenches T, e.g., because RIE operates under conditions intermediately between sputter and plasma etching, and may be used to produce relatively deep, narrow features. Further types of etching may be considered to be wet etching or dry etching. Wet etch is performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., nitride) isotopically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases which approach the wafer approximately from one direction, and therefore this process is highly anisotropic. Trenches formed in first region R1 may be separately identified as first trench(es) T1. Trenches formed in second region R2 may be separately identified as second trench(es) T2. Plurality of trenches T may be distributed uniformly across insulator layer 214 and each region R1, R2, thereof. Thus, the horizontal separation distance between each adjacent trenches may be substantially equal throughout insulator layer 214. According to an example, the uniform separation distance between adjacent trenches in plurality of trenches T may be, e.g., between approximately fifteen nanometers (nm) and approximately two-hundred nm.

Figure 4:
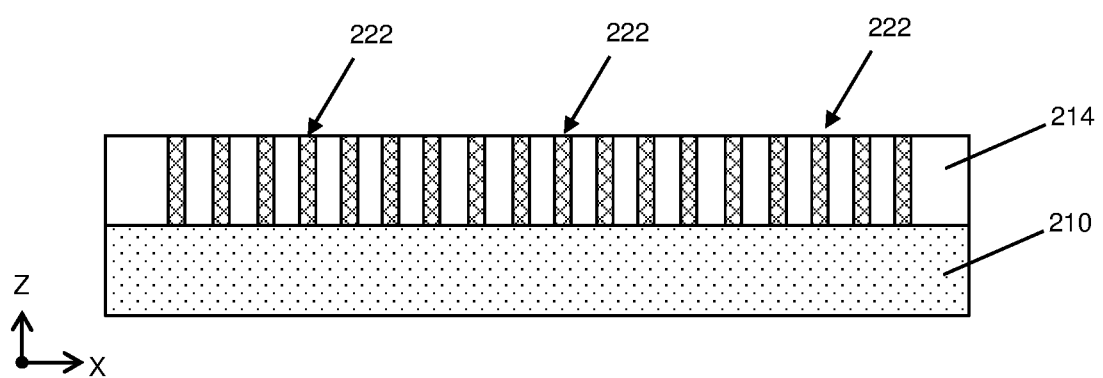
FIG. 4 shows a cross-sectional view of filling the set of trenches with a dummy grating material in methods according to embodiments of the disclosure.

Turning to FIG. 4, the method may include forming one or more materials to fill plurality of trenches T (FIG. 3). Although various diffraction grating materials may be formed immediately after plurality of trenches T (FIG. 3) is formed within insulator layer 214, this may not be practical in all instances. For example, one or more diffraction grating materials may also be used elsewhere in an IC structure, e.g., to form insulative liners, trench isolation regions, and/or other components formed of the same material. To reduce the total number of steps, non-functional materials may be formed in plurality of trenches T before being removed in subsequent processes. According to one example, a dummy grating material 222 may be deposited within plurality of trenches T (FIG. 3) to approximately the height of insulator layer 214. Dummy grating material 222 may include, e.g., one or more currently known or later developed placeholder materials capable of being selectively etched relative to insulator layer 214. According to an example, dummy grating material 222 may include one or more materials suitable for use in a dummy transistor gate or other placeholder component, e.g., polycrystalline Silicon (poly-Si) or amorphous silicon (a-Si). Dummy grating material 222 may be formed by deposition to fill plurality of trenches T, and may be etched back and/or planarized to the height of insulator layer 214. In this case, plurality of trenches T each may be filled with dummy grating material 222 as part of an existing process to form dummy gate structures elsewhere on the same structure. Chemical mechanical planarization (CMP), for example, may remove any initially-deposited material above the height of insulator layer 214.

Figure 5:
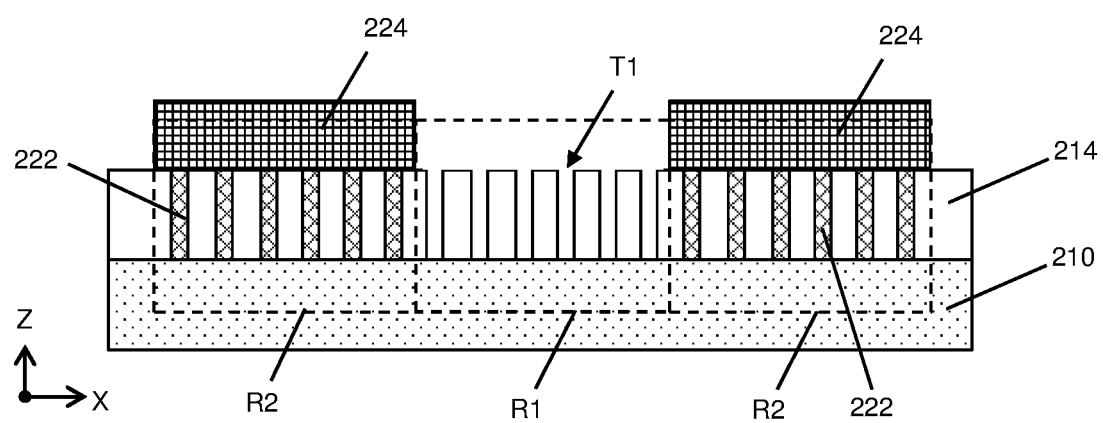
FIG. 5 shows a cross-sectional view of forming a mask and removing the dummy grating material from a set of first trenches in methods according to embodiments of the disclosure.

Referring to FIG. 5, continued processing according to the disclosure may involve removing and replacing selected portions of dummy grating material 222. Removed portions of dummy grating material 222 may be replaced with different optical grating materials to form the various optical gratings in a structure for aligning layers of an IC. Some of the eventual optical grating materials may be different from each other to provide greater optical contrast as compared to conventional alignment structures. One or more masks 224 may be formed on insulator layer 214 to cover second region R2 of insulator layer 214. Mask(s) 224 may initially be a liquid deposited on the surface of insulator layer 214 as a thin film, then solidified by low temperature anneal. Locations not covered by mask(s) 224 may be susceptible to processing, e.g., by various etchants as discussed herein, while other portions of insulator layer 214 covered by mask(s) 224 will be protected. Mask(s) 224 may not be formed over first region R1, causing dummy grating material 222 in first region R1 to be susceptible to etching. Dummy grating material 222 may be removed from trenches not covered by mask(s) 224, e.g., by one or more etchants selective to poly-Si or other materials included in dummy grating material 222. Removing dummy grating material 222 with mask(s) 224 in place will open first trench(es) T1, while dummy grating material 222 remains intact elsewhere within insulator layer 214. The etching of dummy grating material 222 at this stage, or in subsequent processing stages, may be integrated into other etching processes performed elsewhere on the same device structure. For example, the same etching process used to remove portions of a dummy gate, separate a single gate structure into multiple horizontally-aligned gate structures, etc., may simultaneously remove dummy grating material 222 from insulator layer 214.

Figure 6:
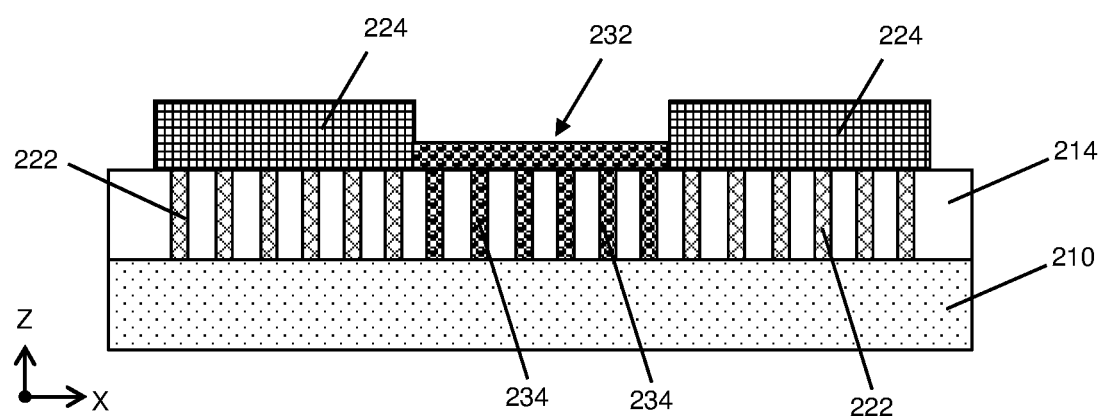
FIG. 6 shows a cross-sectional view of forming a first grating material in the set of first trenches in methods according to embodiments of the disclosure.

Referring now to FIG. 6, additional materials may be formed to replace the removed dummy grating material 222. The additional materials may be formed within first trench(es) T1 (FIGS. 3, 5) with mask(s) 224 remaining in place, as shown by example in FIG. 6, or alternatively may be formed after mask(s) 224 is removed (e.g., by stripping or other process to remove masking materials). First trenches T1 may be filled by depositing a first grating material 232 to fill the space within each trench. The deposited first grating material 232 may include a unitary material 234 having a single material composition. Such materials may include, e.g., one or more silicon based optical grating materials. According to an example, first grating material 232 may be formed by depositing unitary material 234 as a layer of silicon nitride (SiN) to fill first trench(es) T1 to at least the height of insulator layer 214. Unitary material 234 may initially be deposited to a height above insulator layer 214, but less than the height of mask(s) 224 above insulator layer 214.

Figure 7:
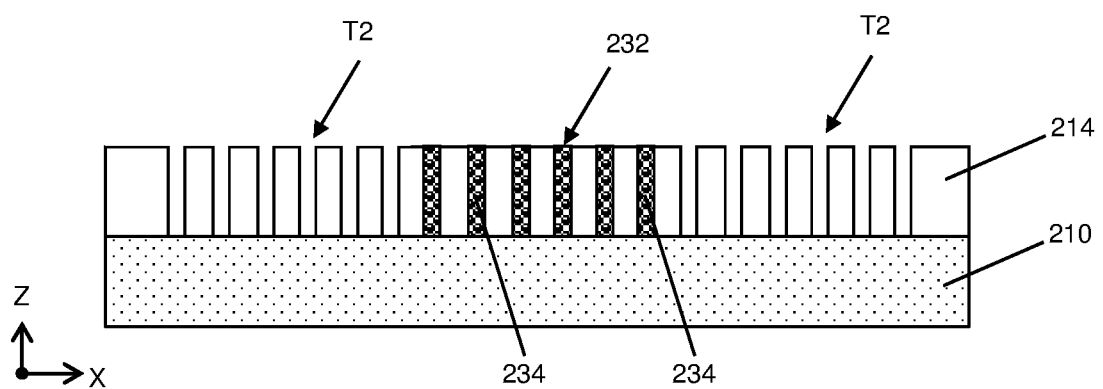
FIG. 7 shows a cross-sectional view of removing the mask and dummy grating material in methods according to embodiments of the disclosure.

FIG. 7 depicts further processes of removing mask(s) 224 and selectively etching the remaining dummy grating material 222 (FIGS. 4-6) to re-form second trenches T2. Mask(s) 224 may be removed by stripping, i.e., a process in which masking materials (e.g., photoresist layers) are removed from a surface of another material. Stripping may occur, e.g., after processes such as etching or ion implantation where mask(s) 224 protect underlying materials from continued processing. Stripping may involve the use of wet or dry (ashing) strongly oxidizing chemistries. Suitable etching materials may depend on the composition of mask(s) 224, and/or the composition of materials not covered by mask(s) 224. Subsequently, the deposited unitary material 234 may be planarized, after mask 224 removal, to the upper surface of insulator layer 214. First grating material 232 may thereafter remain within insulator layer 214 to provide optical contrast with other subsequently-formed grating materials in different regions of insulator layer 214. Once mask(s) 224 are removed to reveal remaining portions of dummy grating material 222, continued processing may include selectively removing dummy grating material 222 while leaving the previously-formed first grating material 232 intact. As noted elsewhere herein, one or more wet etchants selective to dummy grating material 222 may be suitable to re-form second trench(es) T2. Such wet etchants may also be non-reactive to SiN or other materials included in first grating material 232, thereby automatically preventing first grating material(s) 232 from being removed inadvertently. At this stage, second trenches T2 are formed within selected portions of insulator layer 214, while first grating material(s) 232 remains within other portions of insulator layer 214.

Figure 8:
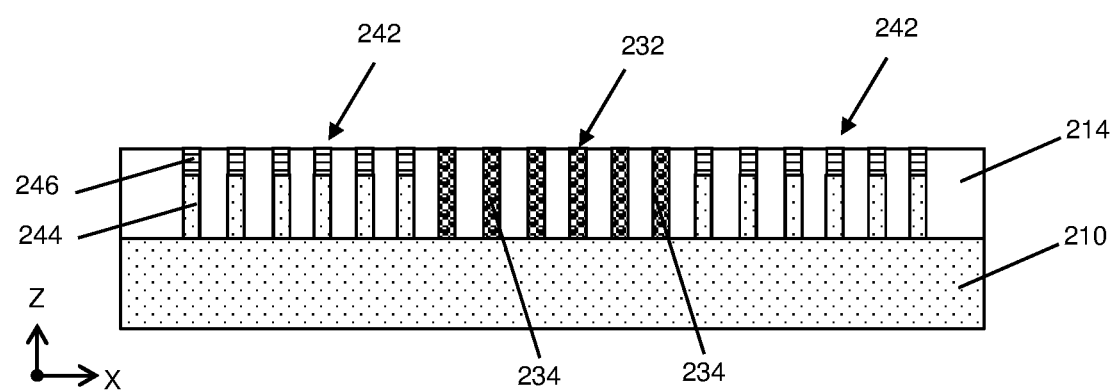
FIG. 8 shows a cross-sectional view of forming a second grating material in a set of second trenches of the insulator material in methods according to embodiments of the disclosure.

Proceeding to FIG. 8, continued processing may include forming a second grating material 242 in the re-formed second trench(es) T2 (FIG. 7), without otherwise affecting first grating material 232. Second grating material 242 may be formed to include different materials from those previously formed as part of first grating material 232. In some cases, second grating material 242 may be a unitary region of one or more grating materials distinct from first grating material 232. In other cases, e.g., the example shown in FIG. 7, second grating material 242 may include multiple separately-deposited layers of material. Second grating material 242 may include, e.g., a semiconductor material 244 deposited over substrate 210 within second trench(es) T2 to less than the height of insulator layer 214. The depositing of semiconductor material 244 may include depositing one or more semiconductor materials to an initial height, and then etching the deposited semiconductor to less than the height of insulator layer 214. Next, a grating layer 246 may be deposited on the upper surface of semiconductor material 244 to fill the remainder of second trench(es) T2. Grating layer 246 may include one or more optically diffractive materials different from that of first grating material 232, e.g., one or more non-silicon based optical grating materials. According to an example, grating layer 246 of second grating material 242 may include titanium nitride (TiN) on semiconductor material 244. Upon being deposited, and thereafter planarized, grating layer 246 may have an upper surface substantially coplanar with the upper surface of insulator layer 214 and first grating material 232. At this point, substantially all of the previously-deposited dummy grating material 222 (FIGS. 3-6) may have been replaced with first grating material 232 or second grating material 242.

First grating material 232 and second grating material 242 may be formed of materials having a high optical contrast with respect to each other. As noted previously, first grating material may include a silicon based grating (e.g., SiN) while second grating material may include a non-silicon based grating (e.g., TiN). These two example material types, as well as others with similar reflective properties, may have a light intensity contrast of at least approximately seventy percent. According to further examples, first grating material 232 may have at least approximately ten percent more of an intensity contrast with respect to second grating material 242, than with respect to the composition of insulator layer 214. In any case, it has been determined that using grating materials 232, 242 to provide stronger image contrast than between first grating material 232 and insulator layer 214 will mitigate or otherwise eliminate inherent asymmetry effects of first grating material 232. Additionally, forming each grating material 232, 242 in a uniformly-spaced set of trenches, as discussed elsewhere herein, further counteracts the inherent asymmetry of the individual grating materials within insulator 214. The uniform density of grating materials 232, 242 within insulator 214 is distinct from conventional alignment structures which feature grating materials with a non-uniform area density.

Figure 9:
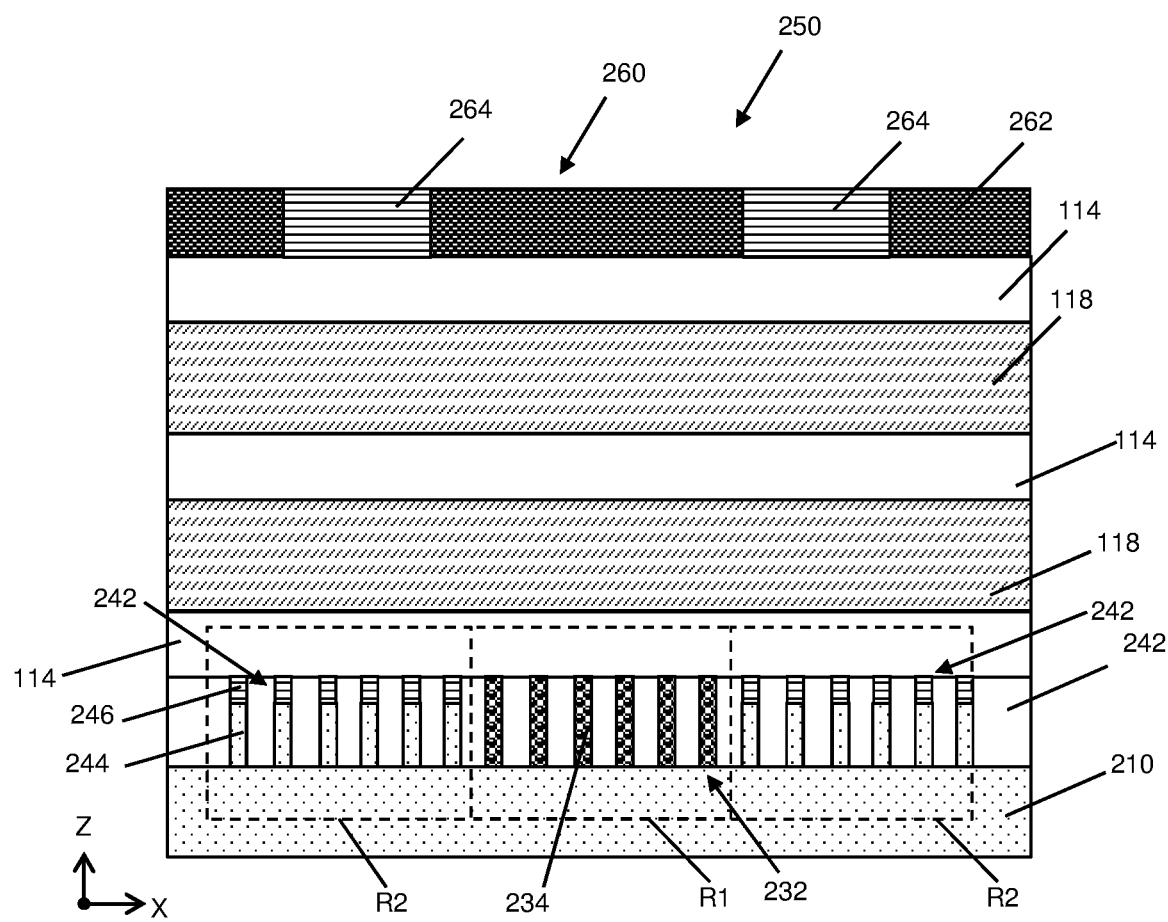
FIG. 9 shows a cross-sectional view of an apparatus for aligning layers of the IC structure according to embodiments of the disclosure.

Referring now to FIG. 9, an embodiment of an apparatus 250 for aligning layers of an IC is shown. Apparatus 250 may be formed from the various processes discussed elsewhere herein, following by subsequent forming of overlying layers and components thereof. As discussed elsewhere herein, e.g., relative to FIG. 2, continued manufacturing may include forming one or more layers of ILD 114, alternating with intermediate layers 118 configured to form various metal wires, vias, etc., therein. Each subsequently formed ILD 114 and intermediate layer 118 may not include functional components positioned over first and second grating materials 232, 242. First grating material 232 may be formed within first region R1 of insulator layer 214. Second grating material 242 may be formed within second region R2 of insulator layer 214. The uniform separation distance between each adjacent portion of grating material 232, 242 may be between approximately fifteen nm and approximately two-hundred nm.

Additional masks may include overlay marks for alignment with previously-formed grating material(s) 232, 242. Methods of the disclosure thus may include forming one or more additional mask(s) 260 vertically above first and second grating materials 232, 242. Additional mask(s) 260 may include a photoresist region 262 configured to protect underlying materials from being processed (e.g., etched, implanted, or modified via other procedures) as overlying layers of an IC are formed. Additional mask(s) 260 may also include an overlay mark 264 composed of one or more translucent materials. Overlay mark 264 may be configured for substantial vertical alignment with first and/or second grating materials 232, 242 of apparatus 250. As shown, overlay mark 264 may be configured to be aligned solely with second grating material 242. In this case, first grating material 232 may be positioned vertically below portions of additional mask(s) 260 which do not include overlay mark(s) 264.

During manufacture, the various features of apparatus 250 may provide greater optical contrast and reduced risk of misalignment than conventional apparatus structures. In conventional methods, insulator layer 214 may only include one region of grating material. Moreover, portions of insulator layer 214 not positioned beneath a corresponding overlay mark may not include any grating materials. In such cases, the single grating material may be identifiable based on its optical contrast with insulator layer 214. As noted previously, conventional grating material(s) and corresponding overlay mark(s) may be misaligned with each other because of the inherent asymmetry of the conventional grating structure. By contrast, apparatus 250 provides a stronger visual contrast between the vertically-aligned portions of insulator layer 214 and vertically non-aligned portions of insulator layer 214.

Figure 10:
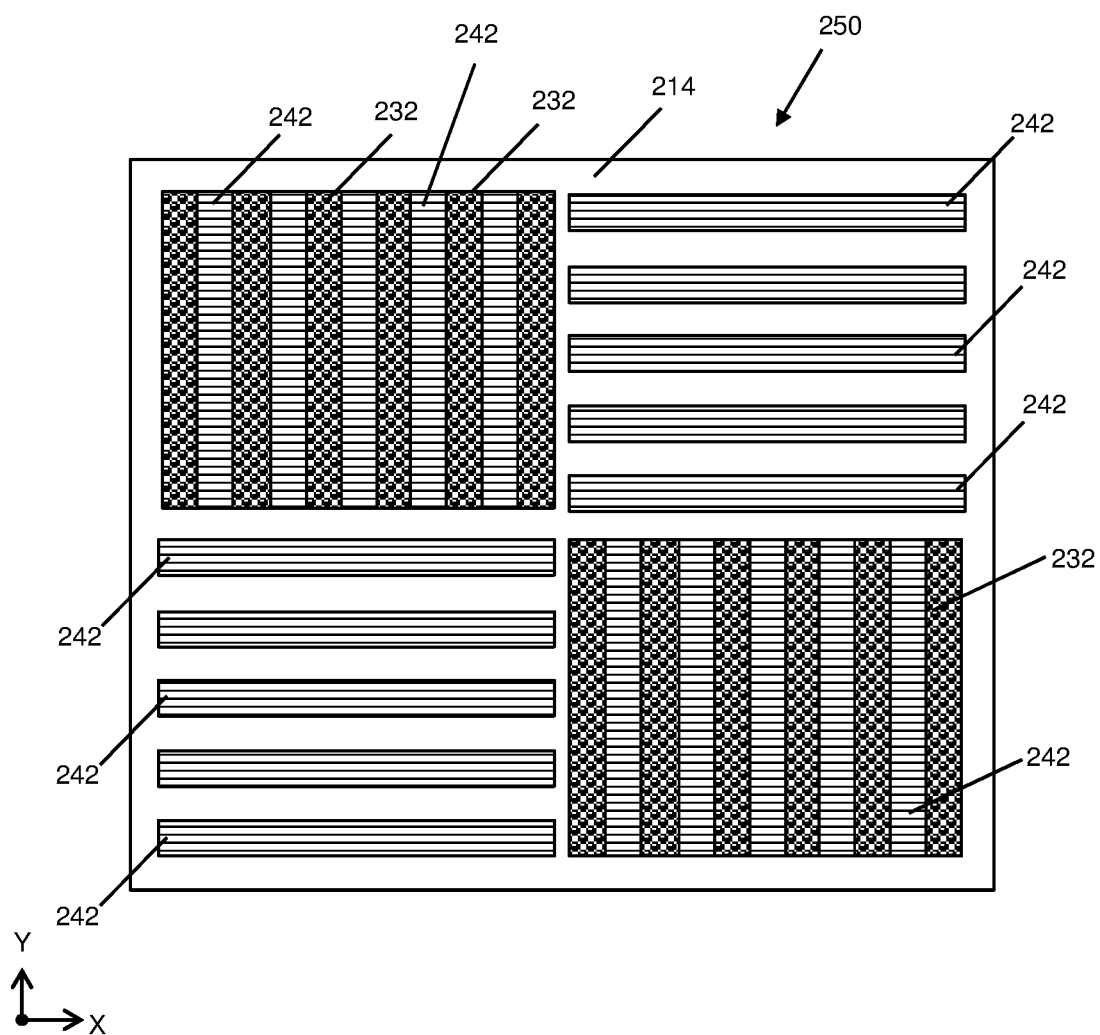
FIG. 10 shows a plan view of the apparatus for aligning layers of the IC structure according to further embodiments of the disclosure.

Now referring to FIG. 10, a plan view of apparatus 250 is shown to provide an example of a spatial arrangement of grating materials 232, 242 across insulator layer 214. As shown in the example of FIG. 10, some embodiments of apparatus 250 may include multiple grating materials 232, 242 in selected portions of insulator layer 214. In other portions of insulator layer 214, only one grating material 232, 242 may be used. As shown, various subsets of each grating material 232, 242 may be arranged as horizontally-extending grating regions having a substantially parallel horizontal orientation within insulator layer 214. In the specific example of FIG. 10, two groups of first and second grating materials 232, 242 extend substantially in parallel with the Y direction, while other groups of second grating materials 242 extend substantially in parallel with the X direction. The presence of second grating material 242 in close proximity to at least one area with first grating material 232 will provide a higher optical contrast as compared to regions of apparatus 250 without second grating material 242. The arrangement in FIG. 10 is provided solely as an example, and it is understood that grating materials 232, 242 may be provided in any conceivable arrangement, e.g., concentric or non-concentric geometries such as circles, ovals, triangles, polygons, etc. The various possible arrangements of grating materials 232, 242 may be provided on separate circuit dies cut from a single wafer or different wafers. In other cases, a single circuit die may include several types of geometric arrangements of grating materials 232, 242 on a single insulator layer 214. In still further examples, different geometric arrangements of grating materials 232, 242 may be provided to identify different regions, functions, etc., on a circuit die to be manufactured and deployed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An apparatus for aligning layers of an integrated circuit (IC), the apparatus comprising:
    an insulator layer positioned above a semiconductor substrate;
    a first diffraction grating within a first region of the insulator layer, the first diffraction grating including a first grating material within the first region of the insulator layer; and
    a second diffraction grating within a second region of the insulator layer, the second diffraction grating including a second grating material within the second region of the insulator layer, wherein the second grating material is different from the first grating material, and wherein an optical contrast between the first and second grating materials is greater than an optical contrast between the second grating material and the insulator layer,
    wherein the first diffraction grating includes a unitary layer of the first grating material, and wherein the second diffraction grating includes a semiconductor layer over the substrate, and the second grating material over the semiconductor layer.

2. The apparatus of claim 1, wherein the first grating material includes silicon nitride (SiN).

3. The apparatus of claim 2, wherein the second grating material includes titanium nitride (TiN).

4. The apparatus of claim 1, wherein the first diffraction grating and the second diffraction grating have a substantially parallel horizontal orientation within the insulator layer.

5. The apparatus of claim 1, wherein a horizontal separation distance between the first and second diffraction gratings is between approximately fifteen nanometers (nm) and approximately two-hundred nm.

6. The apparatus of claim 1, wherein the first grating material and the second grating material are each formed in a plurality of trenches within the insulator layer, the plurality of trenches being uniformly distributed across the insulator layer.

7. The apparatus of claim 1, wherein a height of the first diffraction grating above the substrate is approximately equal to a height of the second diffraction grating above the substrate.

8. An apparatus for aligning layers of an integrated circuit (IC), the apparatus comprising:
   an insulator layer positioned above a semiconductor substrate; and
   a plurality of alignment marks within the insulator layer, each of the plurality of alignment marks including:
      a first diffraction grating within a first region of the insulator layer, the first diffraction grating including a first grating material within the first region of the insulator layer, and
      a second diffraction grating within a second region of the insulator layer, the second diffraction grating including a second grating material within the second region of the insulator layer,
      wherein the second grating material is different from the first grating material, and an optical contrast between the first and second grating materials is greater than an optical contrast between the second grating material and the insulator layer;
   wherein the first and second diffraction grating of each of the plurality of alignment marks are oriented horizontally within the insulator layer, the first diffraction grating of each of the plurality of alignment marks includes a unitary layer of the first grating material, the second diffraction grating of each of the plurality of alignment marks includes a semiconductor layer over the substrate, and the second grating material over the semiconductor layer, and wherein at least one of the plurality of alignment marks is oriented horizontally perpendicularly with respect to another one of the plurality of alignment marks.

9. The apparatus of claim 8, wherein the first grating material includes silicon nitride (SiN).

10. The apparatus of claim 9, wherein the second grating material includes titanium nitride (TiN).

11. A method to form an alignment mark for an integrated circuit (IC), the method comprising:
   forming a plurality of trenches within an insulator layer positioned above a semiconductor substrate, wherein the plurality of trenches includes at least one first trench in a first region of the insulator layer and at least one second trench in a second region of the insulator layer;
   forming a mask on the insulator layer to cover the second region of the insulator layer;
   forming a first grating material within the at least one first trench, wherein forming the first grating material includes:
      depositing silicon nitride (SiN) within the at least one first trench, and
      planarizing the deposited SiN to an upper surface of the insulator layer;
   removing the mask; and
   forming a second grating material within the at least one second trench, wherein the second grating material is different from the first grating material, and an optical contrast between the first and second grating materials is greater than an optical contrast between the second grating material and the insulator layer, and wherein forming the second grating material includes:
      depositing a semiconductor material within the at least one second trench,
      depositing titanium nitride (TiN) on the semiconductor material within the at least one second trench, and
      planarizing the deposited TiN to an upper surface of the insulator layer.

12. The method of claim 11, further comprising:
   forming a dummy grating material within each of the plurality of trenches before forming the mask on the insulator layer, wherein the dummy grating material is different from the first and second grating materials;
   removing the dummy grating material from the at least one first trench before forming the first grating material; and
   removing the dummy grating material from the at least one second trench before forming the second grating material.

13. The method of claim 12, wherein the dummy grating material remains within the at least one second trench during the forming of the first grating material.

14. The method of claim 11, further comprising forming an additional mask above the first and second grating materials, wherein an overlay mark of the additional mask is substantially vertically non-aligned with the first grating material, and substantially vertically aligned with the second grating material.

15. The method of claim 11, wherein forming the first grating material includes depositing a unitary region of the first grating material within the at least one first trench.

16. The method of claim 11, wherein forming the plurality of trenches includes defining a uniform horizontal separation distance between each pair of adjacent trenches in the plurality of trenches.

* * * * *